(12) United States Patent
Yamada et al.

(10) Patent No.: US 7,932,108 B2
(45) Date of Patent: Apr. 26, 2011

(54) METHOD OF PREPARING A SEALED LIGHT-EMITTING DIODE CHIP

(75) Inventors: Toshiaki Yamada, Niigata (JP); Masaki Yoshida, Niigata (JP); Satoko Takahashi, Niigata (JP)

(73) Assignee: Namics Corporation, Niigata-shi, Niigata (JP)

( * ) Notice: Subject to any disclaimer, the term of this patent is extended or adjusted under 35 U.S.C. 154(b) by 247 days.

(21) Appl. No.: 12/215,281

(22) Filed: Jun. 26, 2008

(65) Prior Publication Data

US 2009/0020779 A1 Jan. 22, 2009

(30) Foreign Application Priority Data

Jun. 27, 2007 (JP) .................................. 2007-169011

(51) Int. Cl.
*H01L 21/00* (2006.01)

(52) U.S. Cl. ................... 438/26; 438/127; 257/E21.502
(58) Field of Classification Search ................... 438/26, 438/27, 28, 127; 257/E21.502
See application file for complete search history.

(56) References Cited

U.S. PATENT DOCUMENTS 7,534,663 B2 * 5/2009 Ogawa et al. ................. 438/127
2007/0231469 A1 * 10/2007 Lin et al. ..................... 427/96.1

FOREIGN PATENT DOCUMENTS

JP 2006-165326 A 6/2006

* cited by examiner

*Primary Examiner* — Lex Malsawma
(74) *Attorney, Agent, or Firm* — Holtz, Holtz, Goodman & Chick P C

(57) ABSTRACT

A method for producing a light emitting diode chip encapsulation product, the method comprising covering a light emitting diode chip connected onto a substrate with a thermosetting film, and thermally curing the thermosetting film.

11 Claims, 13 Drawing Sheets

METHOD OF PREPARING A SEALED LIGHT-EMITTING DIODE CHIP

FIELD OF THE INVENTION

The present invention relates to a method for producing a light emitting diode chip encapsulation product, a light emitting diode produced by the method, and a light emitting device.

BACKGROUND ART

A light emitting diode has advantageous features, such as long life, low power consumption, low heat generation, high speed response, high impact resistance, excellent environmental sustainability, and small size, and has been applied to various fields of backlight for liquid crystal display, signal, lighting, display device, and others.

A conventional light emitting diode is produced in a way such that a light emitting diode chip is connected to an interposer, lead frame or substrate by die bonding, and optionally a wiring is formed by wire bonding or the like, followed by resin encapsulation.

Examples of methods for the resin encapsulation include a casting (potting) method in which a light emitting diode chip or the like is embedded in a die and then a liquid resin is charged into the die, followed by curing of the liquid resin, a molding method in which a solid resin is melted by heating and subjected to injection molding using a mold or the like, and a printing method. A casting method is used in the production of so-called shell-type light emitting diode and molding-type light emitting diode, and a molding method is used in, e.g., molding of a plurality of light emitting diode chips at the same time using a lead frame and an organic substrate. With respect to the material for encapsulation, thermosetting epoxy or silicone transparent resins are widely used (Patent document 1).

A single light emitting diode has low intensity of light emission, and therefore a plurality of light emitting diodes are used in combination in some applications. A combination of the light emitting diodes can advantageously be applied to various forms of devices, e.g., a rectangular light emitting device, such as a display, or a rounded light emitting device, such as a signal.

[Patent document 1] Japanese Unexamined Patent Publication No. 2006-165326

DISCLOSURE OF THE INVENTION

Problems to be Solved by the Invention

However, in the production of a combination of a plurality of light emitting diodes applied to, e.g., a signal or lighting, there is needed a step for disposing the light emitting diodes in a desired form or pattern, and the step poses a problem in that, for producing a complicated form or pattern, the step is cumbersome or the shape of a mold or the like is complex. Therefore, a simple and convenient step, especially for a method for encapsulation of many light emitting diode chips has been desired.

Means to Solve the Problems

The present invention is directed to a method for producing a light emitting diode chip encapsulation product, wherein the method comprises covering a light emitting diode chip connected onto a substrate with a thermosetting film, and thermally curing the thermosetting film.

Effect of the Invention

In the method for producing a light emitting diode chip encapsulation product of the present invention, a light emitting diode chip is covered using a thermosetting film, and therefore encapsulation of the chip can be achieved in a simple and convenient step. Particularly, encapsulation of many, for example, ten or more light emitting diode chips can be made at the same time in a simple and convenient step.

BEST MODE FOR CARRYING OUT THE INVENTION

Figure 1:
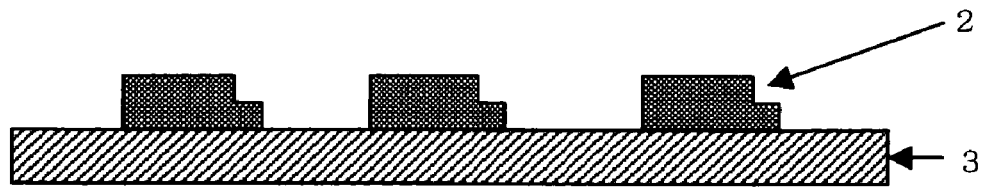
FIGS. 1(A) to 1(D) are diagrams explaining an example of the method for producing a light emitting diode chip encapsulation product of the present invention.
Figure 1:
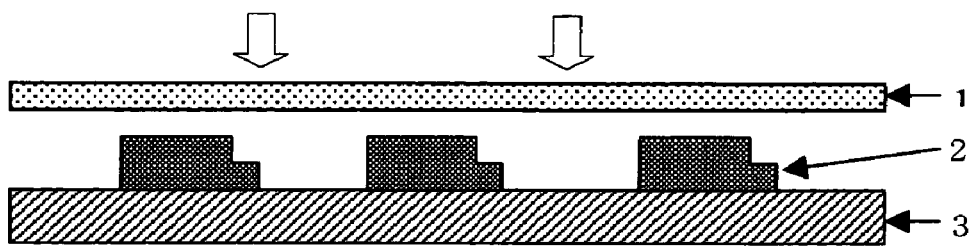
Figure 1:
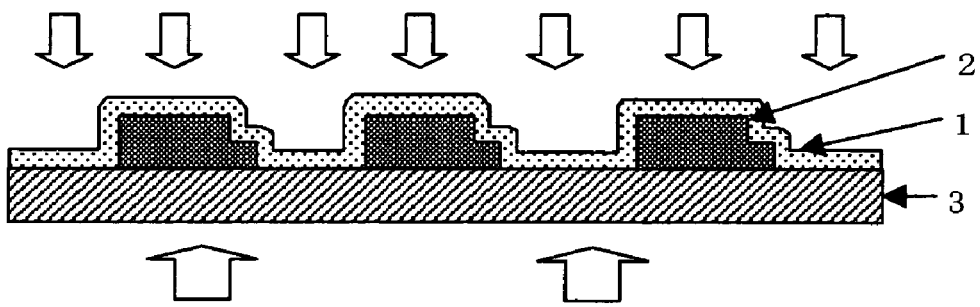
Figure 1:
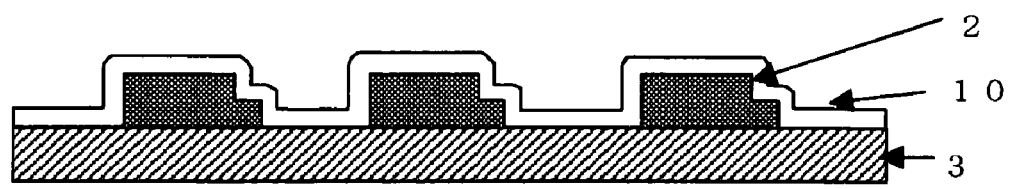

The present invention is a method for producing a light emitting diode chip encapsulation product, wherein the method comprises covering a light emitting diode chip connected onto a substrate with a thermosetting film, and thermally curing the thermosetting film.

The materials, members, parts, apparatuses, and others used in the method of the present invention are first described.

In the present invention, with respect to the "light emitting diode chip", there is no particular limitation as long as it is a chip for use in general light emitting diode. The "light emitting diode" may be any light emitting diode, and a wiring is connected to the light emitting diode chip in which the diode can emit light.

Further, in the present invention, the term "light emitting diode chip encapsulation product" means an encapsulation product containing a light emitting diode, and the light emitting diode chip encapsulation product can be directly used as a light emitting diode or the light emitting diode chip encapsulation product is subjected to post-step and the resultant product is used as a light emitting diode. The "encapsulation" is conducted mainly for the purpose of preventing deterioration of the light emitting diode chip and wiring connected to the light emitting diode chip due to moisture contained in air and others.

In the present invention, with respect to the "substrate", there is no particular limitation as long as it is a substrate capable of supporting a light emitting diode chip, such as a printed substrate or a ceramic substrate.

In the present invention, the term "thermosetting film" means a film which is curable due to heating and which enables encapsulation of a light emitting diode chip, and examples include an uncured film comprising an A-stage resin.

For preventing attenuation of the light emitted from the light emitting diode chip, it is preferred that the thermosetting film thermally cured is capable of transmitting light. With respect to the thermosetting film thermally cured which is capable of transmitting light, the thermosetting film transmits the light emitted from the light emitting diode chip and can be used in a desired application.

From the viewpoint of preventing the lowering of emission efficiency of the light emitting diode chip and suppressing the scattered light, the thermosetting film thermally cured preferably has a refractive index of 1.50 to 1.60, further preferably 1.54 to 1.57.

From the viewpoint of obtaining excellent encapsulation and high dielectric strength of the thermosetting film, it is preferred that the thermosetting film before thermally cured has a thickness 1.2 to 1.5 times the height of the light emitting diode chip. When the thickness of the thermosetting film before cured is 1.2 times or more the height of the light emitting diode chip, it is possible to prevent poor encapsulation or low dielectric strength caused due to a lack of the amount of the thermosetting film applied. On the other hand, when the thickness is 1.5 times or less the height of the light emitting diode chip, it is possible to prevent an excess thermosetting film from overflowing to the periphery of the encapsulation portion or to prevent the formation of flashes.

The thickness of the thermosetting film before thermally cured is affected by a pitch of the light emitting diode chip and a pad portion or the like on a printed substrate electrically connected to the light emitting diode chip. From the viewpoint of obtaining, e.g., high dielectric strength, it is preferred that the thermosetting film has a thickness of at least 25 to 50 μm, relative to 1 mm of the pitch.

The thermosetting film being thermally cured preferably exhibits a shrinkage percentage of 0.5 to 3.0%, further preferably 2.0 to 3.0%. When the shrinkage percentage is 0.5% or more, the thermosetting film per se is satisfactory in strength, and, when the shrinkage percentage is 3.0% or less, for example, pinholes are prevented from being formed in the thermosetting film. In the present invention, the shrinkage percentage is a linear shrinkage percentage and determined as follows. A thermosetting film is put on a silicon substrate, and a thickness of the thermosetting film before thermally cured is measured using a non-contact thickness meter. Then, a thickness of the thermosetting film, which is cured at 180° C. under atmospheric pressure for 2 hours, is measured in the same manner as in the measurement for the thermosetting film before thermally cured. (1−(Thickness of film cured)/(Thickness of film before thermally cured)) percentage is used as a shrinkage percentage.

With respect to the viscosity of the thermosetting film, from the viewpoint of achieving excellent covering for the uneven surface of, e.g., a substrate, and preventing a chip comprised of, e.g., silicon from suffering a damage and preventing pinholes and the like from being formed in the thermosetting film, the viscosity at a temperature of 150 to 200° C. is preferably 10 to $10^4$ Pa·s, further preferably 10 to $10^3$ Pa·s.

Next, the individual steps in the method of the present invention are described. As shown in FIG. 1, the method of the present invention comprises the steps of covering light emitting diode chip 2 connected onto substrate 3 with thermosetting film 1 (FIG. 1(B)), and thermally curing thermosetting film 1 (FIG. 1(C)).

The thermally curing step can be conducted either after covering light emitting diode chip 2 with thermosetting film 1 or simultaneously with covering.

In the present invention, the "covering" is made for the purpose of encapsulation of a light emitting diode chip, and it is not necessary that the entire surface of other members, such as a substrate, be covered with the film.

The step for covering light emitting diode chip 2 with thermosetting film 1 is performed by covering a desired encapsulation portion on, e.g., substrate 3 or light emitting diode chip 2 with thermosetting film 1, and, for improving the covering of thermosetting film 1 for light emitting diode 2 or substrate 3, or, e.g., a lead frame, or for reducing the voids between light emitting diode 2 or substrate 3, or, e.g., a lead frame, and thermosetting film 1, it is more preferred that lamination is conducted.

The lamination is preferably conducted under a vacuum pressure, further preferably using a vacuum press or a vacuum roll. Examples of conditions for the lamination using a vacuum roll include those at 80 to 100° C. and 0.05 to 0.5 MPa. The roll speed of the vacuum roll can be appropriately selected depending on, e.g., the rate of the next thermally curing step. With respect to the lamination step, thermosetting film 1 is flexible and therefore, for preventing thermosetting film 1 from excessively deforming, it is preferred that the lamination is conducted under a vacuum pressure in a short time, for example, even when a vacuum press is used.

It is preferred that the step for thermally curing thermosetting film 1 is conducted under a vacuum pressure (FIG. 1(C)). When the step is conducted under a vacuum pressure, the embedding property of thermosetting film 1 for light emitting diode chip 2 or substrate 3 can be improved, or the voids between light emitting diode chip 2 or substrate 3, or, e.g., a lead frame, and thermosetting film 1 can be reduced.

In the step in which thermosetting film 1 is thermally cured under a vacuum pressure, it is further preferred that a vacuum press or a vacuum roll is used.

In the press surface of the vacuum press or the roll surface of the vacuum roll, a carbon steel material such as an SK material, an SKS material or an SCM material, cemented carbide or stainless steel can be used, or a resin material such as polyethylene, polypropylene, polytetrafluoroethylene or silicone, can be used. The press surface space of the vacuum press or the roll gap of the vacuum roll under a vacuum pressure is preferably 5 to 20 mm from the viewpoint of reducing the voids between, e.g., light emitting diode 2 or substrate 3 and thermosetting film 1 and preventing pinholes from being formed in thermosetting film 1, and from the viewpoint of the total thickness of substrate 3, light emitting diode chip 2, and others and thermosetting film 1.

The optimal conditions for the thermally during step are appropriately selected depending on, for example, the material for and the thickness of thermosetting film 1, the thickness of the substrate, the thickness of light emitting diode 2, and the distance between light emitting diode chips 2.

The degree of vacuum for the vacuum pressure is preferably 1,333 Pa or less from the viewpoint of reducing the voids, further preferably 133 to 667 Pa from the viewpoint of achieving excellent productivity.

In the method for producing a light emitting diode chip encapsulation product of the present invention, an encapsulation product of many light emitting diode chips disposed on a substrate can be produced in a simple and convenient step using an inexpensive apparatus.

Hereinbelow, an embodiment in which an epoxy resin composition is used in the thermosetting film will be described in detail.

It is preferred that the thermosetting film is comprised of an epoxy resin composition from the viewpoint of achieving excellent encapsulation properties. Preferred is a novolak epoxy resin, a modified novolak resin or an epoxy resin containing the above resin.

The thermosetting film can be formed by a method in which a varnish is prepared from a desired resin composition and the resultant varnish is applied onto a support and then dried. In one of embodiments, the varnish comprises (I) at least one epoxy resin selected from the group consisting of a novolak epoxy resin having a phenolic skeleton and a biphenyl skeleton, and a bifunctional linear epoxy resin having a weight average molecular weight of 10,000 to 200,000 and having a hydroxyl group, (II) a modified phenolic novolak having a phenolic hydroxyl group, at least part of which is esterified with a fatty acid, and optionally (III) an isocyanate compound. By using the above varnish, there can be formed a film which can produce a cured product having excellent encapsulation properties.

With respect to Component (I), specific examples of novolak epoxy resins having a phenolic skeleton and a biphenyl skeleton include epoxy resins represented by the following formula (A):

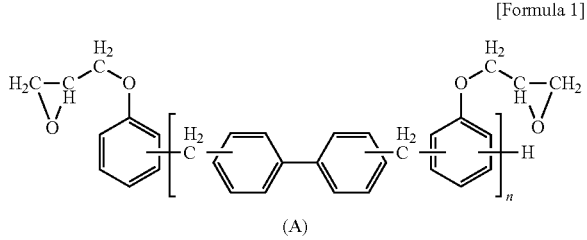

(A)

wherein n represents an average value and is 1 to 10, preferably 1 to 5, especially preferably 1.

With respect to Component (I), preferred examples of bifunctional linear epoxy resins having a weight average molecular weight of 10,000 to 200,000 and having a hydroxyl group include those having a weight average molecular weight of 15,000 to 70,000. The bifunctional linear epoxy resin preferably has a number average molecular weight of 3,700 to 74,000, more preferably 5,500 to 26,000, and has an epoxy equivalent of 5,000 g/equivalent or more. The weight average molecular weight and number average molecular weight are values determined by a gel permeation chromatography (GPC) method in which standard polystyrene is used for molecular weight calibration. Especially preferred examples include bifunctional linear epoxy resins having a weight average molecular weight/number average molecular weight ratio in the range of from 2 to 3.

Specific examples of the epoxy resins include epoxy resins represented by the following formula (B):

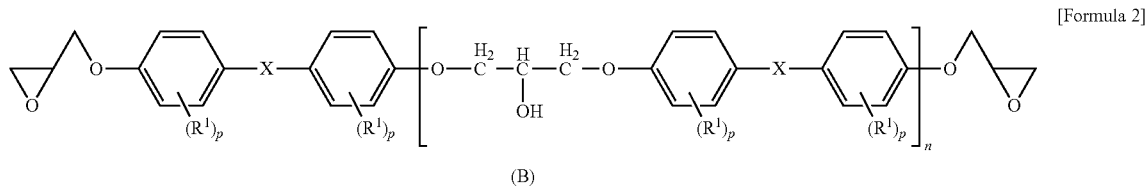

(B)

wherein X may be the same or different from each other and each represents a single bond, a hydrocarbon group having 1 to 7 carbon atoms, —O—, —S—, —SO$_2$—, —CO— or the following group:

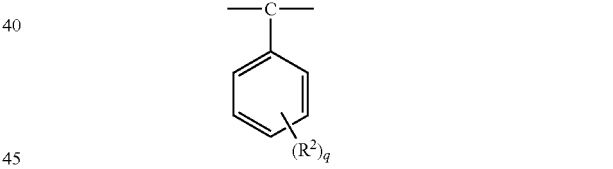

where

R$^2$ each may be the same or different from each other and each represents a hydrocarbon group having 1 to 10 carbon atoms or a halogen atom;

R$^3$ represents a hydrogen atom, a hydrocarbon group having 1 to 10 carbon atoms or a halogen atom; and q may be the same or different from each other and each represents an integer of 0 to 5;

R$^1$ may be the same or different from each other and each represents a hydrocarbon group having 1 to 10 carbon atoms or a halogen atom;

p may be the same or different from each other and each represents an integer of 0 to 4; and n represents an average value and is 25 to 500.

Particularly, preferred examples include epoxy resins of the formula (B) wherein p is 0, i.e., epoxy resins represented by the following formula (B'):

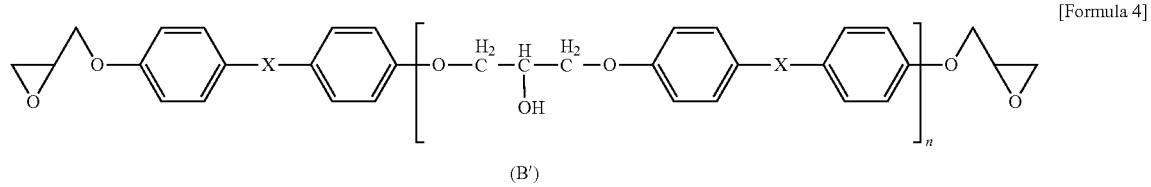

[Formula 4]

wherein X and n have the same meanings as defined for the formula (B).

These epoxy resins can be used individually or in combination of two or more kinds.

With respect to Component (II), examples include modified phenolic novolaks represented by the following formula (C):

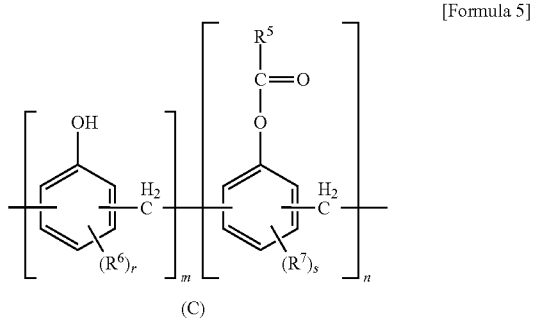

[Formula 5]

wherein $R^5$ may be the same or different from each other and each represents an alkyl group having 1 to 5 carbon atoms, preferably a methyl group, $R^6$ may be the same or different from each other and each represents an alkyl group having 1 to 5 carbon atoms, a substituted or unsubstituted phenyl group, a substituted or unsubstituted aralkyl group, an alkoxy group or a halogen atom, $R^7$ may be the same or different from each other and each represents an alkyl group having 1 to 5 carbon atoms, a substituted or unsubstituted phenyl group, a substituted or unsubstituted aralkyl group, an alkoxy group or a halogen atom, r may be the same or different from each other and each represents an integer of 0 to 3, s may be the same or different from each other and each represents an integer of 0 to 3, and n:m can be 1:1 to 1.2:1.

In the formula (C), n and m are individually an average value of the number of the respective repeating units, and, with respect to the arrangement of the repeating units, there is no particular limitation, and it may be either block or random arrangement. Further, in the formula (C), the n:m ratio is more preferably about 1:1. The sum of n and m can be, for example, 2 to 4.

Preferred examples include modified phenolic novolaks of the formula (C) wherein each of r and s is 0, i.e., modified phenolic novolaks represented by the following formula (C'):

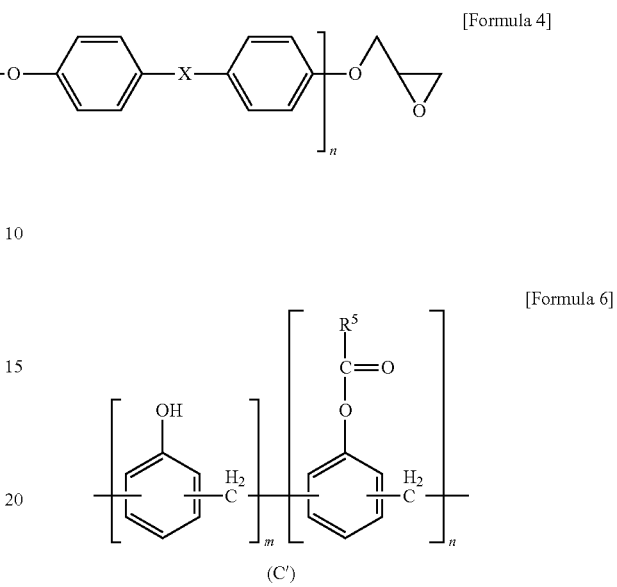

[Formula 6]

wherein $R^5$, n, and m have the same meanings as defined above. Especially preferred is an acetylated phenolic novolak of the formula (C') wherein $R^5$ is a methyl group.

These modified phenolic novolaks can be used individually or in combination of two or more kinds.

With respect to Component (III) optionally contained in the varnish, examples include isocyanate compounds having two or more isocyanate groups. Examples include hexamethylene diisocyanate, diphenylmethane diisocyanate, tolylene diisocyanate, isophorone diisocyanate, dicyclohexylmethane diisocyanate, tetramethylxylene diisocyanate, xylylene diisocyanate, naphthalene diisocyanate, trimethylhexamethylene diisocyanate, tolidine diisocyanate, p-phenylene diisocyanate, cyclohexylene diisocyanate, dimer acid diisocyanate, hydrogenated xylylene diisocyanate, lysine diisocyanate, triphenylmethane triisocyanate, and tri(isocyanatophenyl)triphosphate. Preferred is HMDI (hexamethylene diisocyanate) or DPMDI (diphenylmethane diisocyanate). The isocyanate compound includes a pre-polymer comprising an isocyanate compound, part of which forms an isocyanurate ring due to cyclization. Examples include a prepolymer comprising a trimer of isocyanate compound.

With respect to the amounts of components (I) and (II) in the varnish, the amount of Component (II) is preferably 30 to 200 parts by weight, more preferably 50 to 180 parts by weight, relative to 100 parts by weight of Component (I). When Component (I) is the novolak epoxy resin having a phenolic skeleton and a biphenyl skeleton, it is preferred that the amount of Component (II) is 30 to 70 parts by weight. When Component (I) is the bifunctional linear epoxy resin, it is preferred that the amount of Component (II) is 120 to 180 parts by weight. Component (III) can be used in an amount of 100 to 400 parts by weight, preferably 300 to 350 parts by weight, relative to 100 parts by weight of Component (I).

In the varnish, if necessary, an additive, such as a tackifier, a defoamer, a flow modifier, a film forming auxiliary or a dispersing agent, can be incorporated.

The varnish is obtained by diluting the above-mentioned Component (I), Component (II), optional Component (III), and an arbitrary additive with a solvent. A solvent can be appropriately selected, and examples include ketones, such as ethyl methyl ketone and methyl isobutyl ketone; aromatic solvents, such as toluene and xylene; and high boiling-point solvents, such as dioctyl phthalate and dibutyl phthalate. A solvent can be used in such an amount that the resultant varnish has a solids content of 1 to 95% by weight.

The varnish having a viscosity in the range of from 1 to 10,000 mPa·s is usable, and, from the viewpoint of achieving excellent transfer, the varnish preferably has a viscosity of 10 to 1,000 mPa·s. From the viewpoint of obtaining a uniform thickness, the varnish preferably has a viscosity of 100 to 600 mPa·s. The viscosity is a value as measured at 25° C. using an E-type viscometer at a rotational speed of 60 rpm.

With respect to the method for applying the varnish onto a support, there is no particular limitation, but, from the viewpoint of obtaining a thin film and controlling the film thickness, preferred is a microgravure method, a slot die method or a doctor blade method. When a microgravure method is employed, an insulating layer having a thickness of 20 μm or less can be obtained by, for example, using a varnish having a small solids content or selecting a gravure roll having a small cell capacity.

Conditions for drying the varnish can be appropriately selected depending on the type or amount of the organic solvent used in the varnish or the thickness of the varnish applied, and, for example, conditions at 80 to 120° C. for about 1 to 30 minutes can be selected. The thus obtained thermosetting film is in an uncured state.

Next, an embodiment in which the encapsulation product is used is described in detail using the thermosetting film.

When the thermosetting film is so thin that encapsulation of the light emitting diode chip is not satisfactory in the viewpoint of, e.g., preventing the formation of pinholes, the thermosetting films can be stacked so that the resultant stacked film has a desired thickness.

With respect to the thermally curing conditions for the thermosetting film, thermally curing conditions for general thermosetting resin can be used.

The thermally curing can be performed stepwise if desired. As a preferred example of the stepwise thermally curing step using an epoxy resin in the thermosetting film, there can be mentioned a thermally curing step for the thermosetting film, comprising a first thermally curing step at 70 to 100° C. at 0.05 to 0.5 MPa for 20 to 40 minutes, a second thermally curing step at 120 to 140° C. under atmospheric pressure for 20 to 40 minutes, and a third thermally curing step at 150 to 180° C. at 0.2 to 0.5 MPa for 20 to 30 minutes.

Figure 2:
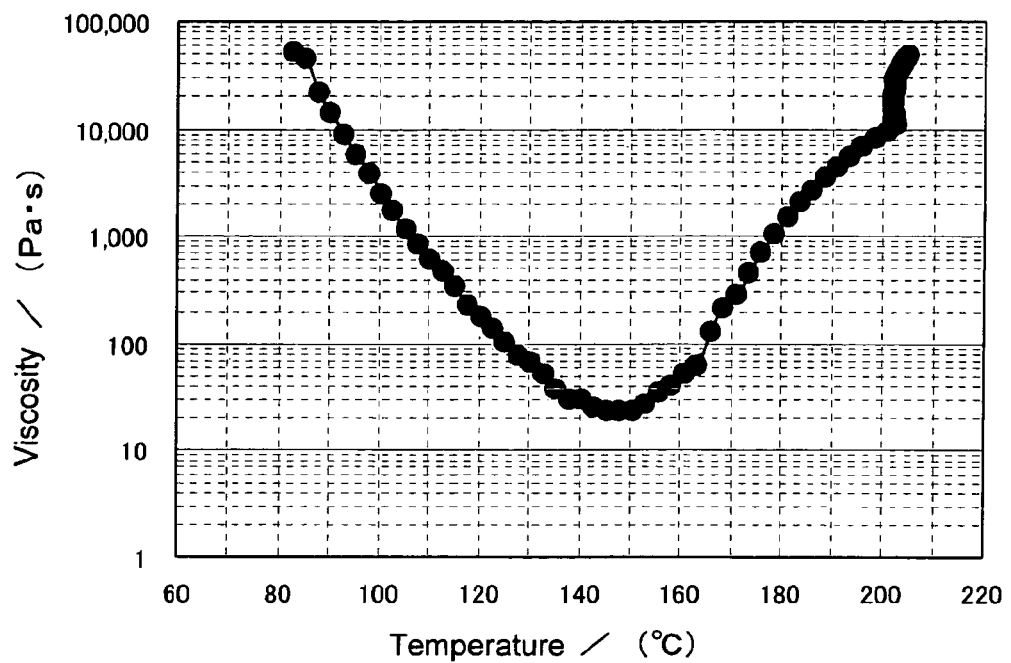
FIG. 2 shows an example of a melt viscosity behavior of a thermosetting film.

FIG. 2 shows an example of the temperature and melt viscosity of a thermosetting film (formulation in Example 1). A melt viscosity was measured using an apparatus, VAR-100, manufactured by REOLOGICA Instruments AB, at a temperature elevation rate of 5° C./min and at a frequency of 1 Hz. As the temperature elevated, the viscosity was reduced to about $1\times10^4$ Pa·s at 92° C., about $1\times10^3$ Pa·s at 105° C., about 300 Pa·s at 115° C., about 200 Pa·s at 120° C., about 30 Pa·s at 140° C., about 23 Pa·s at 150° C., and about 50 Pa·s at 160° C. As the temperature further elevated, the viscosity was increased to about 200 Pa·s at 167° C., about 300 Pa·s at 170° C., about $1\times10^3$ Pa·s at 180° C., and about $1\times10^4$ Pa·s at 200° C.

Figure 3:
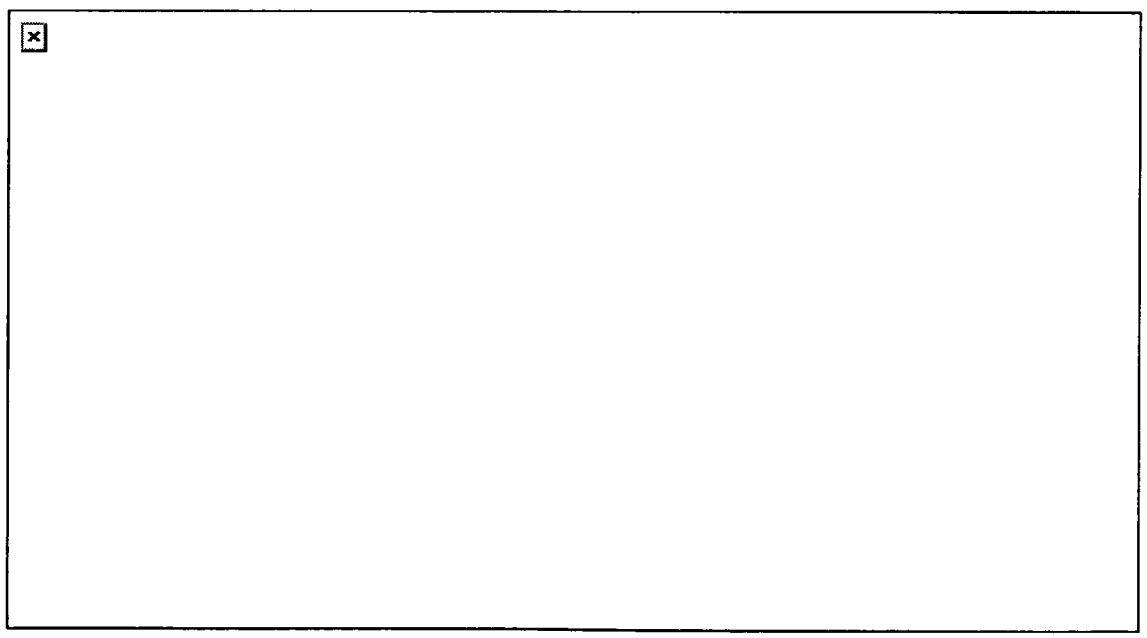
FIG. 3 shows an example of a profile of a vacuum press.

The thermally curing step for the thermosetting film having the relationship between a temperature and a melt viscosity shown in FIG. 2 preferably comprises three stages or more. FIG. 3 shows an example of the thermally curing step using a vacuum press. The step comprises a first thermally curing step at 70° C. at 0.5 MPa for 20 minutes, a second thermally curing step at 120° C. under atmospheric pressure for 120 minutes, and a third thermally curing step at 150° C. at 0.5 MPa for 30 minutes. The pressure in the second thermally curing step is not necessarily atmospheric pressure, and may be a pressure lower than the pressure in the first step.

Hereinbelow, the present invention will be described in more detail with reference to the following experimental Examples, which should not be construed as limiting the scope of the present invention. The indications for amount are part(s) by weight unless otherwise specified.

EXAMPLE 1

Figure 4:
FIG. 4 is a diagram showing a thermosetting film formed on a polyethylene terephthalate film.

A varnish having the formulation shown in Table 1 was prepared. The resultant varnish was applied to a polyethylene terephthalate film coated with a releaser having a thickness of 38 μm and a width of 320 mm by means of a microgravure coater, and dried at 80° C. for 30 minutes to obtain a thermosetting film having a thickness of 40 μm. The thermosetting film obtained was cut into a sheet having a width of 182 mm and a length of 256 mm (FIG. 4).

[Table 1]

TABLE 1

| Material | Parts by weight |
|---|---|
| Bifunctional linear epoxy resin having hydroxyl group (Epoxy equivalent: 12,000 g/equivalent; Number average molecular weight: 14,500; Weight average molecular weight: 39,000) | 100 |
| Acetylated phenolic novolak resin ($R^5$ is methyl group and n:m = 1:1 in Formula (C')) | 155 |
| Hexamethylene diisocyanate | 315 |
| Curing accelerator (2-Ethyl-4-methylimidazole) | 9 |
| Film forming auxiliary (Divinylbenzene) | 102 |
| Initiator (1,1,3,3-Tetramethylbutyl peroxy-2-ethylhexanoate) | 9 |
| Solvent (Ethyl methyl ketone) | 340 |

Figure 5:
FIGS. 5(A) to 5(I) are diagrams explaining the method for producing a light emitting diode chip encapsulation product in Example 1.
Figure 5:
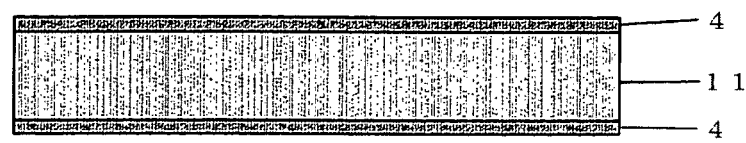
Figure 5:
Figure 5:
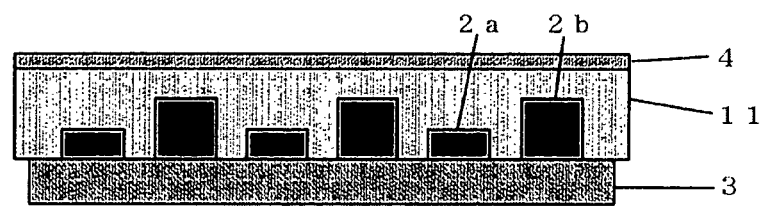
Figure 5:
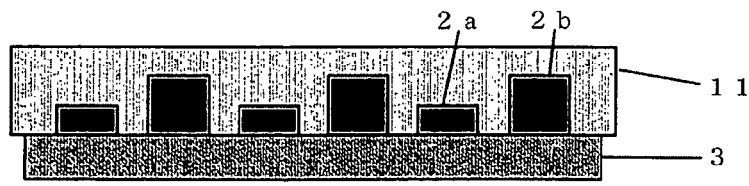
Figure 5:
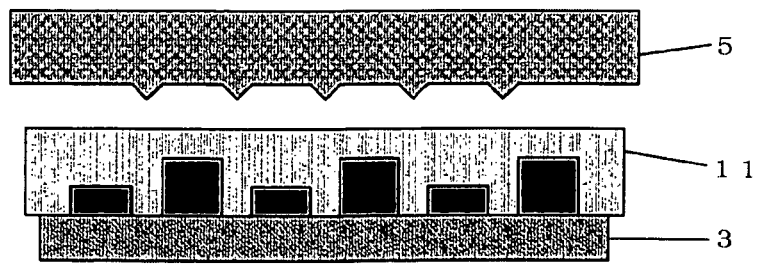
Figure 5:
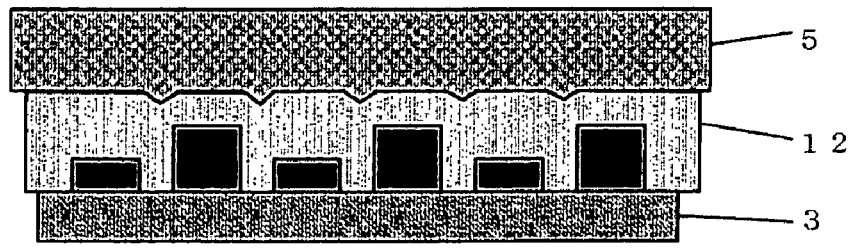
Figure 5:
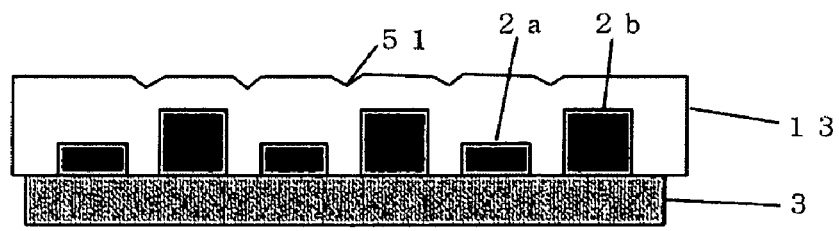
Figure 5:
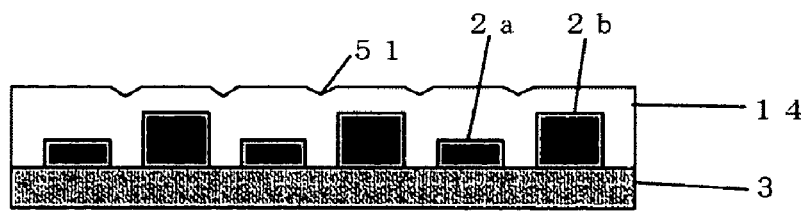

Then, 16 sheets of the cut thermosetting film 1 were stacked on one another (FIG. 5(A)). In this instance, the sheets were disposed so that polyethylene terephthalate film 4 constituted the outside of each of the uppermost layer and the lowermost layer, and polyethylene terephthalate film 4 was removed from thermosetting film 1 constituting the intermediate layer. The stacked thermosetting film 1 was placed in a chamber of a vacuum press and the degree of vacuum in the vacuum press was adjusted to about 133 Pa, and then the stacked thermosetting film was pressed at a temperature of 100° C. under a pressure of 0.2 MPa for 10 minutes to form thermosetting-film laminated film 11 (FIG. 5(B)). Laminated film 11 had a thickness of about 640 μm. It is preferred that thermosetting-film laminated film 11 has flexibility from the viewpoint of reducing voids between the thermosetting film and, e.g., the light emitting diode chip or substrate.

One polyethylene terephthalate film 4 on thermosetting-film laminated film 11 was removed (FIG. 5(C)), and light emitting diode chip 2a having a height of 0.2 mm and light emitting diode chip 2b having a height of 0.5 mm disposed on substrate 3 were covered with the surface of the laminated film from which the polyethylene terephthalate film had been removed. Thermosetting-film laminated film 11 covers light emitting diode chips 2a, 2b, and it is not necessary that the thermosetting-film laminated film cover the entire surface of substrate 3. The resultant substrate 3 covered with thermosetting-film laminated film 11 was placed in a chamber of a vacuum press and the degree of vacuum in the vacuum press was adjusted to about 133 Pa, and then the substrate was pressed at a temperature of 100° C. under a pressure of 0.5 MPa for 30 minutes to precure thermosetting-film laminated film 11 (FIG. 5(D)).

Figure 6:
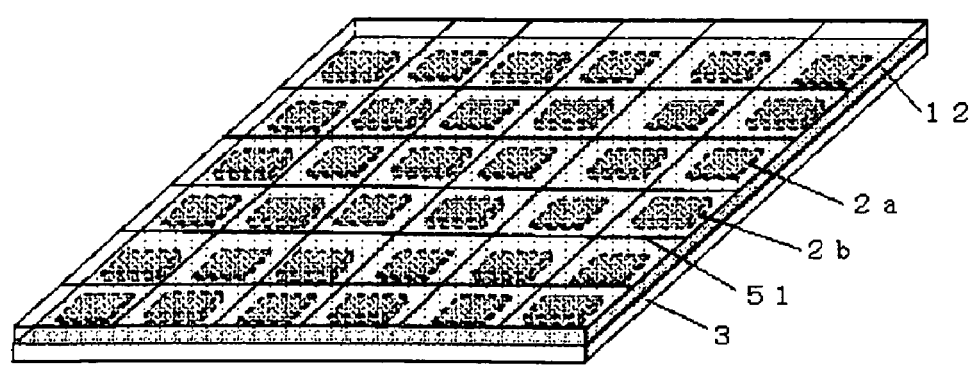
FIG. 6 is a diagram showing an example of grooves formed in a line in the thermosetting-film laminated film.

Then, the remaining polyethylene terephthalate film 4 on thermosetting-film laminated film 11 was removed (FIG. 5(E)), and, using jig 5 having protrusions formed in a line on the surface and being coated with a releaser, grooves 51 in a line form were formed in thermosetting-film laminated film 11 in the vacuum press (FIGS. 5(F) and 5(G)). Grooves 51 in a line form are formed to inhibit the rays of light emitted from light emitting diode chips 2a, 2b from suffering interference, and therefore it is preferred that grooves 51 are formed so that, for example, as shown in FIG. 6, they separate a plurality of light emitting diode chips 2a, 2b from one another. With respect to the releaser, for example, a silicone material is preferably used. When it is not necessary to inhibit the rays of light emitted from light emitting diode chips 2a, 2b from suffering interference, this step can be omitted. In the same vacuum press, thermosetting-film laminated film 12 having grooves 51 formed therein was cured in the step shown in FIG. 3, and then removed from the vacuum press (FIG. 5(H)).

A flash of cured thermosetting-film laminated film 13 overflowing substrate 3 was removed to obtain an encapsulation product of light emitting diode chips 2a, 2b with thermosetting-film laminated film 14 (FIG. 5(I)). With respect to the encapsulation product obtained, a cross-section was observed. As a result, it has been found that thermosetting-film laminated film 14 exhibits such excellent encapsulation properties that no voids are caused even near the uneven portions formed from light emitting diode chips 2a, 2b. Further, with respect to the encapsulation product obtained, an emission test was conducted. The results of the emission test have confirmed that the encapsulation product excellently transmits the light emitted from light emitting diode chips 2a, 2b and causes no interference of light.

Next, thermosetting-film laminated film 11 was cured at 180° C. for 60 minutes. A refractive index was measured by means of a prism coupler (model: SPA-4000; manufactured by SAIRON TECHNOLOGY, INC.). A refractive index at a measurement wavelength of 633 nm was 1.55, and a refractive index at a measurement wavelength of 830 nm was 1.54.

EXAMPLE 2

Figure 7:
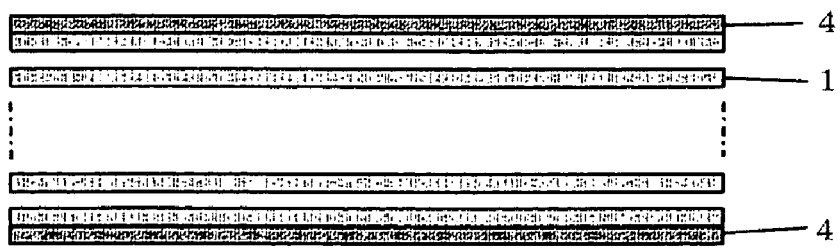
FIGS. 7(A) to 7(I) are diagrams explaining the method for producing a light emitting diode chip encapsulation product in Example 2.
Figure 7:
Figure 7:
Figure 7:
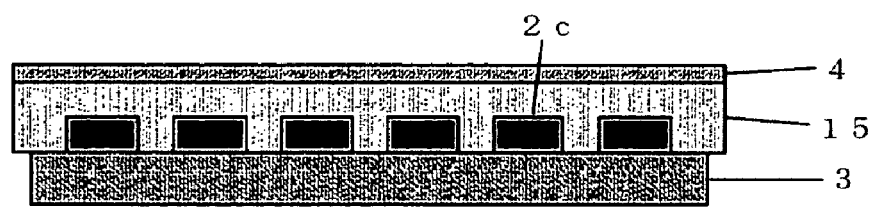
Figure 7:
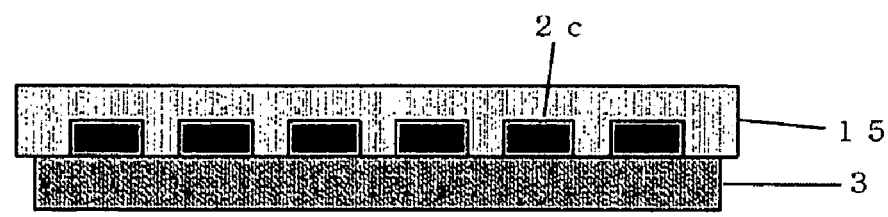
Figure 7:
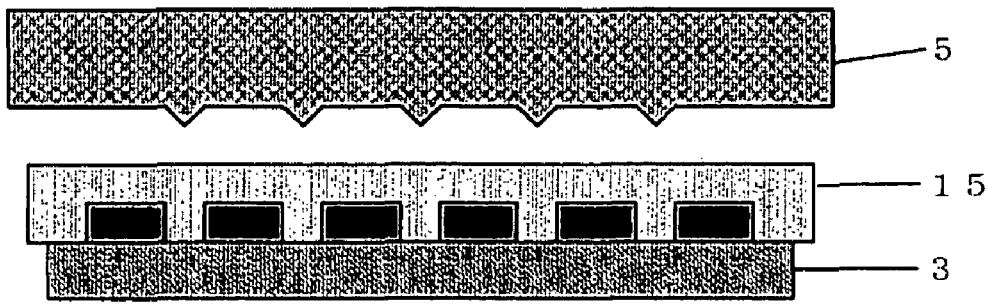
Figure 7:
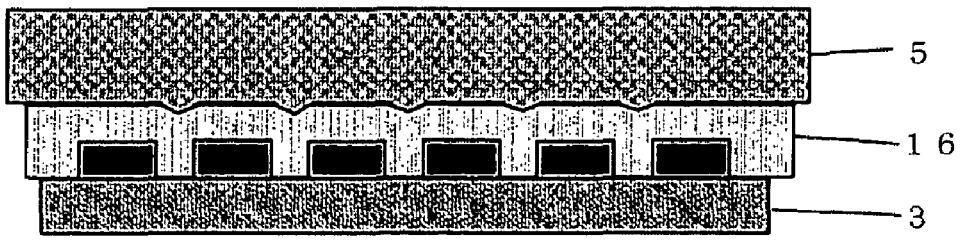
Figure 7:
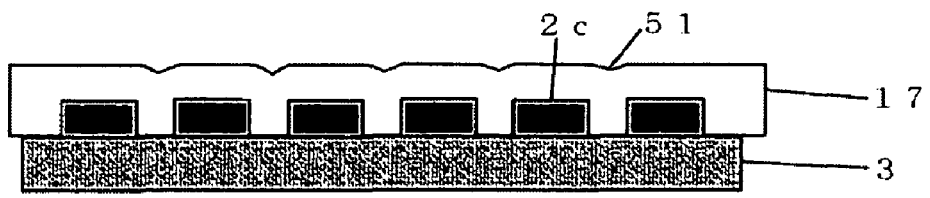
Figure 7:
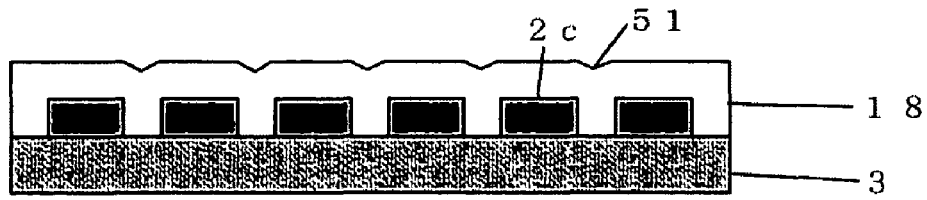

An encapsulation product of light emitting diode chip 2c with thermosetting-film laminated film 18 was formed (FIGS. 7(A) to 7(I)) in substantially the same manner as in Example 1 except that thermosetting-film laminated film 15 was formed using 6 sheets of thermosetting film 1 (FIG. 7(A)), and that light emitting diode chip 2c having a height of 0.2 mm was used (FIG. 7(D)). Laminated film 15 had a thickness of about 240 µm. With respect to the encapsulation product obtained, a cross-section was observed. As a result, it has been found that thermosetting-film laminated film 18 exhibits such excellent encapsulation properties that no voids are caused even near the uneven portions formed from light emitting diode chips 2c. Further, with respect to the encapsulation product obtained, an emission test was conducted. The results of the emission test have confirmed that the encapsulation product excellently transmits the light emitted from light emitting diode chip 2c and causes no interference of light.

EXAMPLE 3

Figure 8:
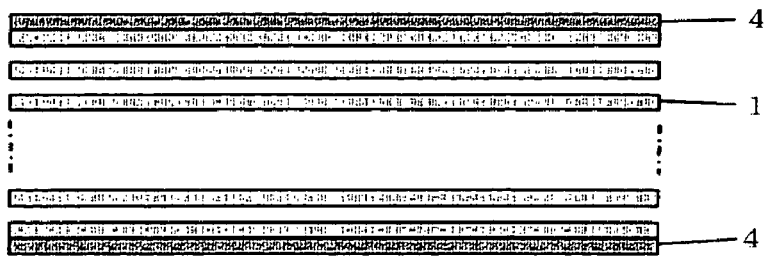
FIGS. 8(A) to 8(I) are diagrams explaining the method for producing a light emitting diode chip encapsulation product in Example 3.
Figure 8:
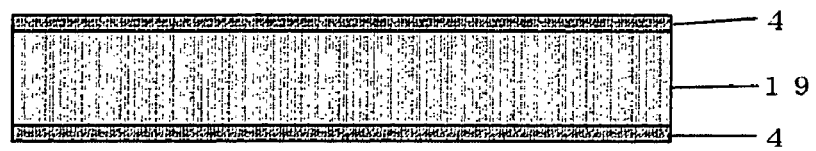
Figure 8:
Figure 8:
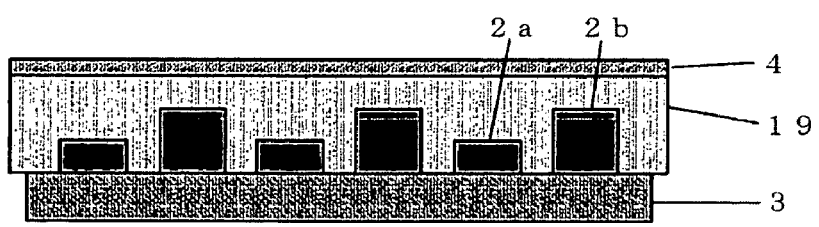
Figure 8:
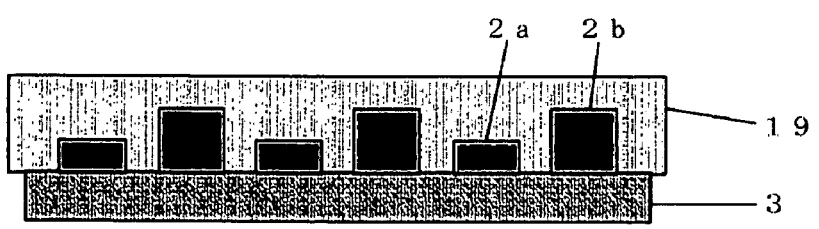
Figure 8:
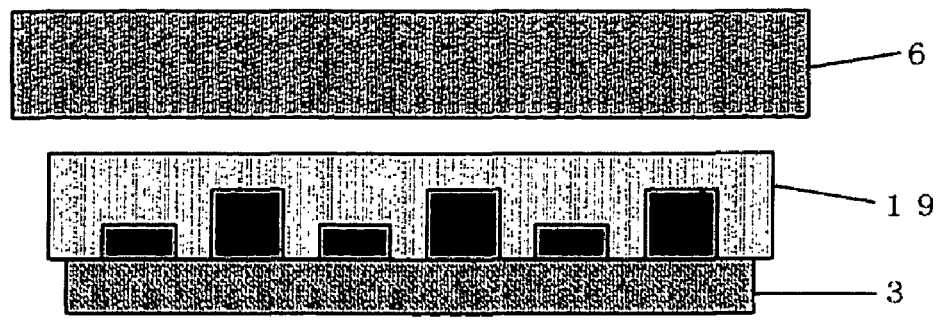
Figure 8:
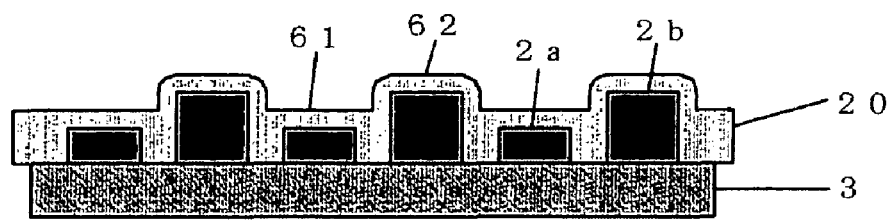
Figure 8:
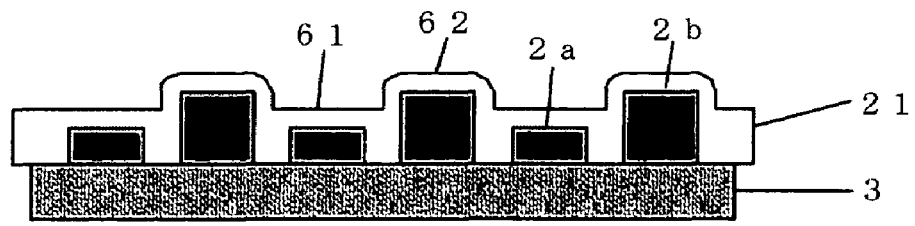
Figure 8:
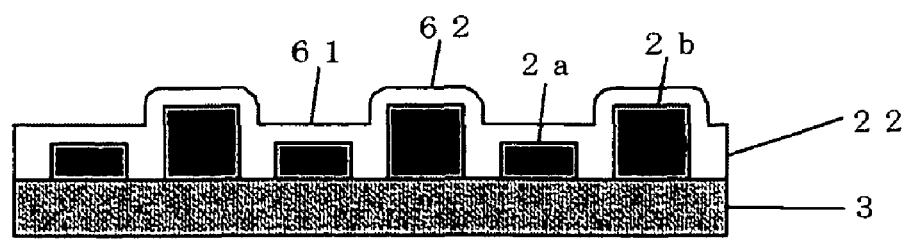

Light emitting diode chips 2a, 2b were covered with thermosetting-film laminated film 19 (FIGS. 8(A) to 8(E)) in substantially the same manner as in Example 1 except that thermosetting-film laminated film 19 was formed using 10 sheets of thermosetting film 1 (FIG. 8(A)), and polyethylene terephthalate film 4 was removed. Laminated film 19 had a thickness of about 400 µm. Then, the resultant substrate 3 covered with thermosetting-film laminated film 19 was placed in a chamber of a vacuum press having a cushioning-treated press surface and the degree of vacuum in the vacuum press was adjusted to about 133 Pa, and then the substrate was pressed at a temperature of 100° C. under a pressure of 0.5 MPa for 30 minutes to precure thermosetting-film laminated film 19 (FIG. 8(F)). The cushioning treatment can be achieved by, for example, covering the press surface with a silicone resin rubber having a thickness of about 2 to 10 mm. By virtue of this step, as seen from portion 61 above light emitting diode chip 2a and portion 62 above light emitting diode chip 2b, the surface of thermosetting-film laminated film 20 was deformed according to the height of the chip (FIG. 8(G)). In the same vacuum press, thermosetting-film laminated film 20 was cured in the step shown in FIG. 3, and then removed from the vacuum press (FIG. 8(H)).

A flash of cured thermosetting-film laminated film 21 overflowing substrate 3 was removed to obtain an encapsulation product of light emitting diode chips 2a, 2b with thermosetting-film laminated film 14 (FIG. 8(I)). With respect to the encapsulation product obtained, a cross-section was observed. As a result, it has been found that thermosetting-film laminated film 22 exhibits such excellent encapsulation properties that no voids are caused even near the uneven portions formed from light emitting diode chips 2a, 2b. Further, with respect to the encapsulation product obtained, an emission test was conducted. The results of the emission test have confirmed that the encapsulation product excellently transmits the light emitted from light emitting diode chips 2a, 2b and causes no interference of light.

Figure 9:
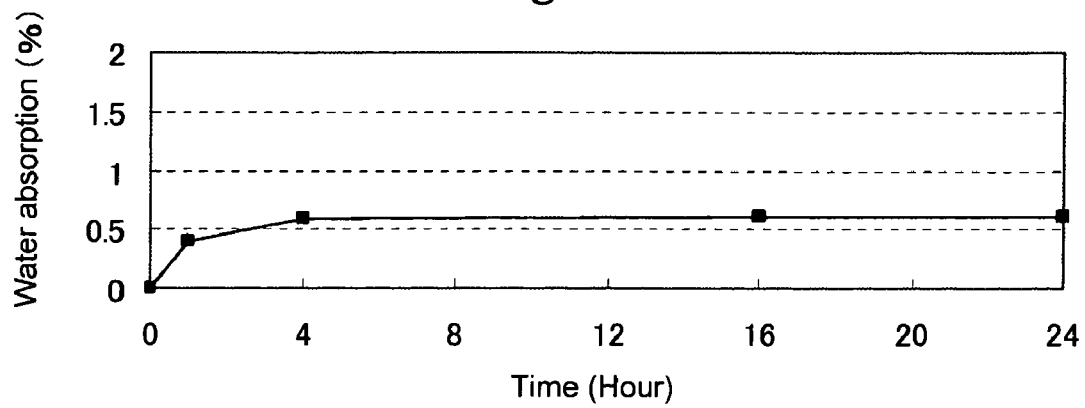
FIG. 9 is a graph showing a change in the water absorption of the thermally cured thermosetting film in a pressure cooker test.

Cured thermosetting film 1 exhibits excellent moisture resistance even under high-temperature and high-humidity conditions. The curing was conducted at 180° C. for 120 minutes. FIG. 9 shows a change in the water absorption of cured thermosetting film 1 in a pressure cooker test (pressure: 0.2 MPa; temperature: 121° C.; relative humidity: 100%). The water absorption after 4 hours from the start of the pressure cooker test was about 0.6%, and the water absorption after 24 hours was about 0.6%, which is substantially the same as that after 4 hours.

Figure 10:
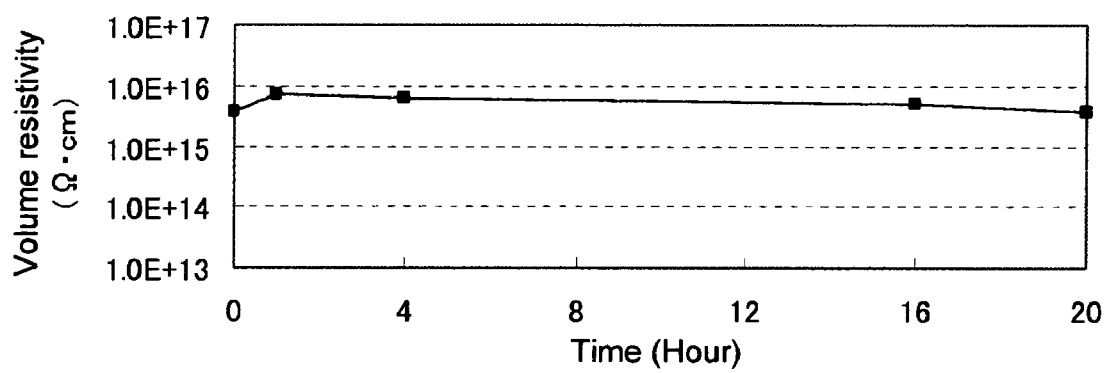
FIG. 10 is a graph showing a change in the volume resistivity of the thermally cured thermosetting film in a pressure cooker test.

FIG. 10 shows a change in the volume resistivity of cured thermosetting film 1 in a pressure cooker test (pressure: 0.2 MPa; temperature: 121° C.; relative humidity: 100%). The volume resistivity before the test was about $4 \times 10^{15}$ Ωcm, the volume resistivity after 1 hour was about $7 \times 10^{15}$ Ωcm, and the volume resistivity after 20 hours was about $4 \times 10^{15}$ Ωcm.

Figure 11:
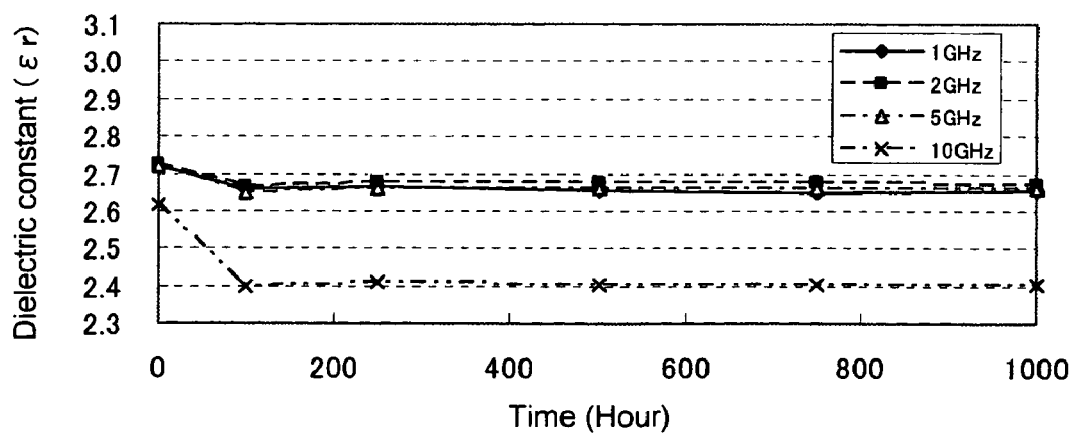
FIG. 11 is a graph showing a change in the dielectric constant of the thermally cured thermosetting film in a high-temperature shelf test.
Figure 12:
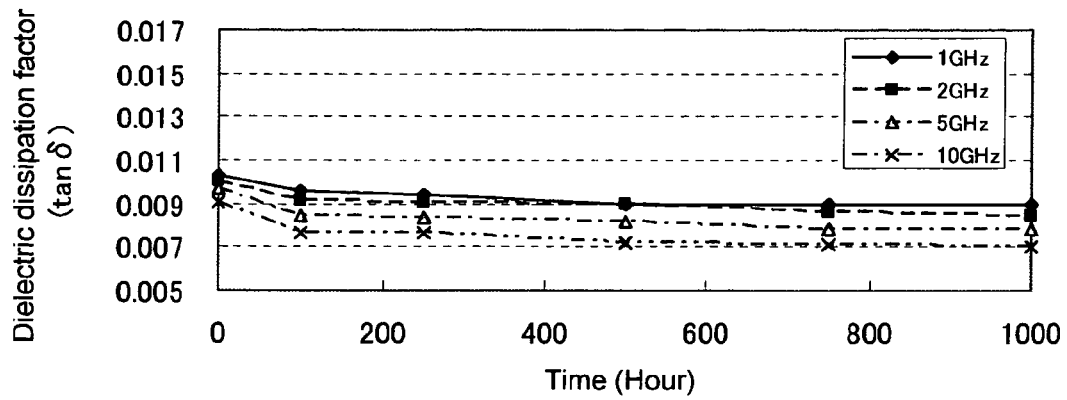
FIG. 12 is a graph showing a change in the dielectric dissipation factor of the thermally cured thermosetting film in a high-temperature shelf test.
Figure 13:
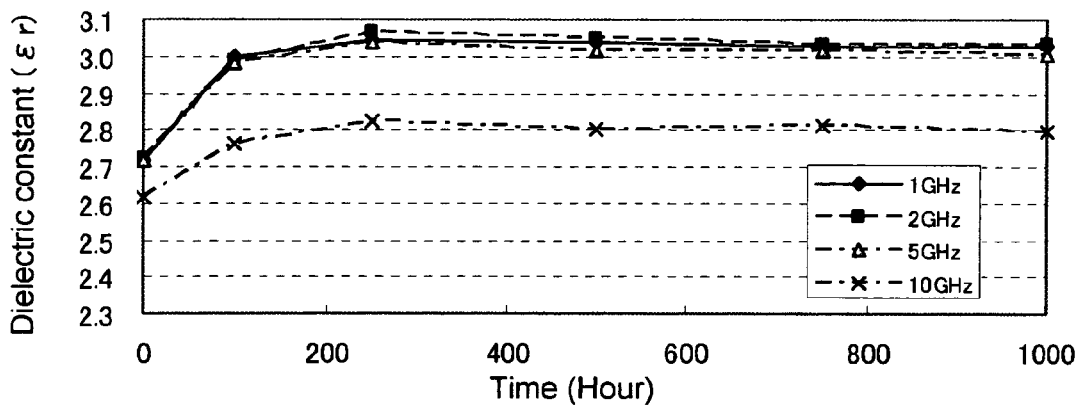
FIG. 13 is a graph showing a change in the dielectric constant of the thermally cured thermosetting film in a high-temperature and high-humidity test.
Figure 14:
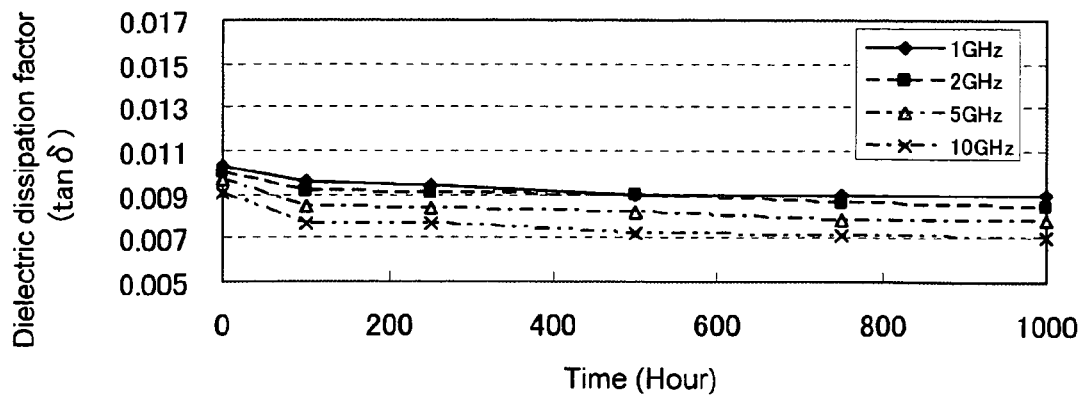
FIG. 14 is a graph showing a change in the dielectric dissipation factor of the thermally cured thermosetting film in a high-temperature and high-humidity test.
Figure 15:
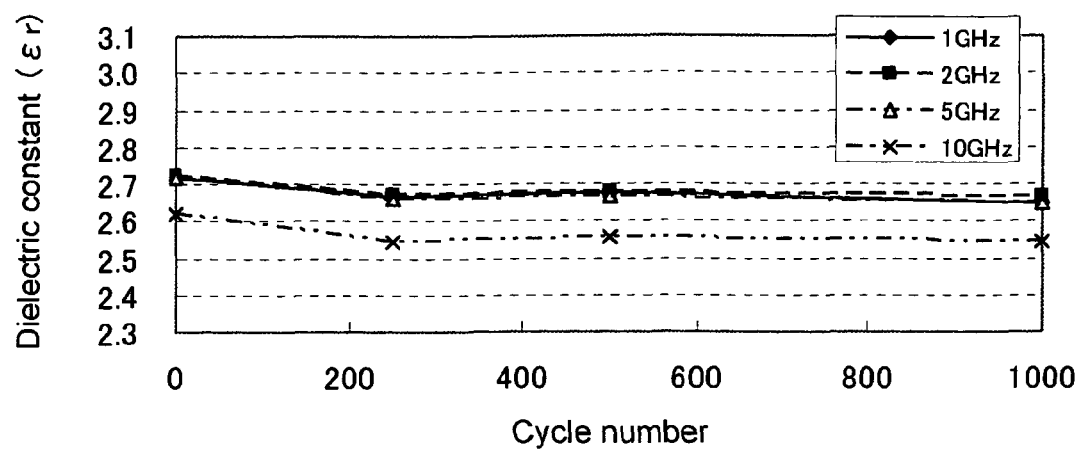
FIG. 15 is a graph showing a change in the dielectric constant of the thermally cured thermosetting film in a heat cycle test.
Figure 16:
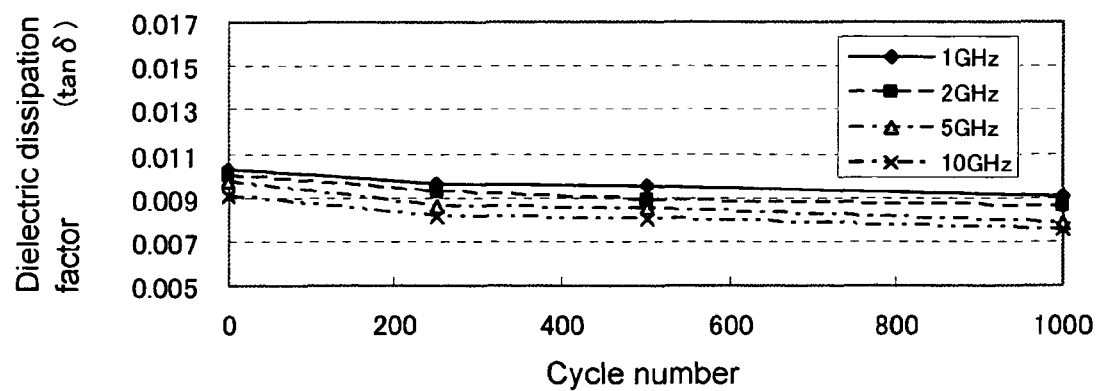
FIG. 16 is a graph showing a change in the dielectric dissipation factor of the thermally cured thermosetting film in a heat cycle test.

FIG. 11 shows a change in the dielectric constant of cured thermosetting film 1 in a high-temperature shelf test (temperature: 125° C.), FIG. 12 shows a change in the dielectric dissipation factor of cured thermosetting film 1 in a high-temperature shelf test (temperature: 125° C.), FIG. 13 shows a change in the dielectric constant of cured thermosetting film 1 in a high-temperature and high-humidity test (temperature: 80° C.; relative humidity: 80%), FIG. 14 shows a change in the dielectric dissipation factor of cured thermosetting film 1 in a high-temperature and high-humidity test (temperature: 80° C.; relative humidity: 80%), FIG. 15 shows a change in the dielectric constant of cured thermosetting film 1 in a heat cycle test (at −55° C. for 30 minutes, at 125° C. for 30 minutes), and FIG. 16 shows a change in the dielectric dissipation factor of cured thermosetting film 1 in a heat cycle test (at −55° C. for 30 minutes, at 125° C. for 30 minutes). A dielectric constant and a dielectric dissipation factor were measured individually at frequencies of 1, 2, 5, and 10 GHz using a cavity resonator (machine name: perturbation method dielectric measurement apparatus; manufactured by Kantoh Electronics Application and Development Inc.). Under any conditions for test, cured thermosetting film 1 exhibited a dielectric constant as excellent as about 2.4 to 3.7. In addition, under any conditions for test, a marked change was not found in the dielectric dissipation factor of cured thermosetting film 1.

Figure 17:
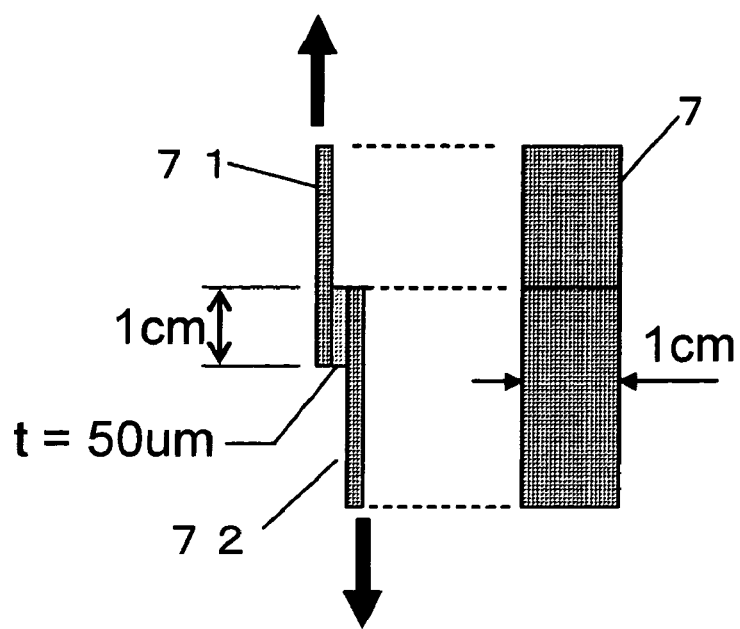
FIG. 17 is a diagram explaining a method for bonding strength test for the thermosetting film thermally cured.

Then, a test for bonding strength of the cured thermosetting film was conducted. As shown in FIG. 17, aluminum plates 71, 72 each having a width of 1 cm, a length of 5.0 cm, and a thickness of 2.0 mm were bonded together using thermosetting film 1 having a width of 1 cm, a length of 1 cm, and a thickness of 50 μm so that the area of aluminum plates 71, 72 bonded together had a width of 1 cm and a length of 1 cm, followed by thermal curing at 120° C. for 120 minutes and further at 150° C. for 120 minutes, to prepare bonding strength test specimen 7. A bonding strength was measured by pulling the specimen in the directions of arrows shown in FIG. 17 using a universal testing machine (model: AG-I), manufactured by Shimadzu Corporation, at a rate of pulling of 5 mm/minute.

Figure 18:
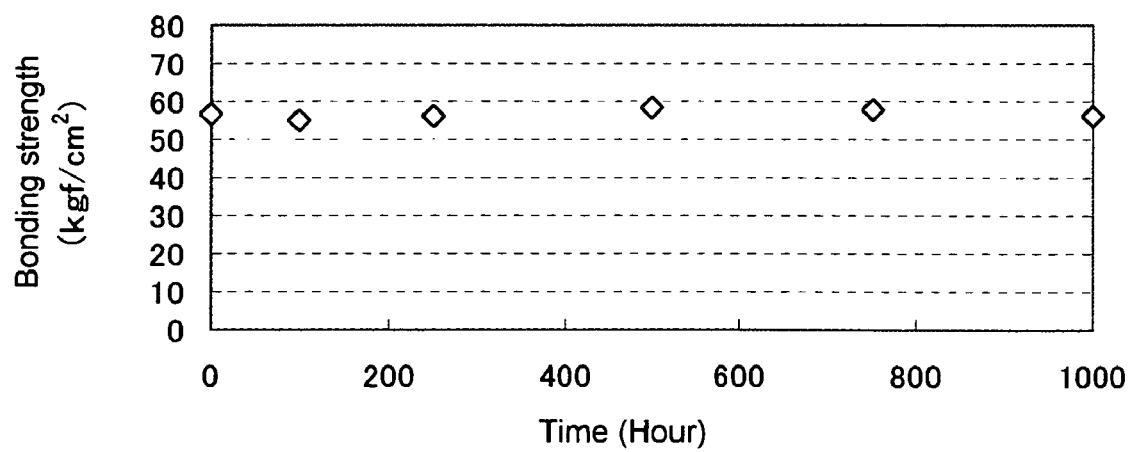
FIG. 18 is a graph showing a change in the bonding strength of the thermally cured thermosetting film in a high-temperature shelf test.
Figure 19:
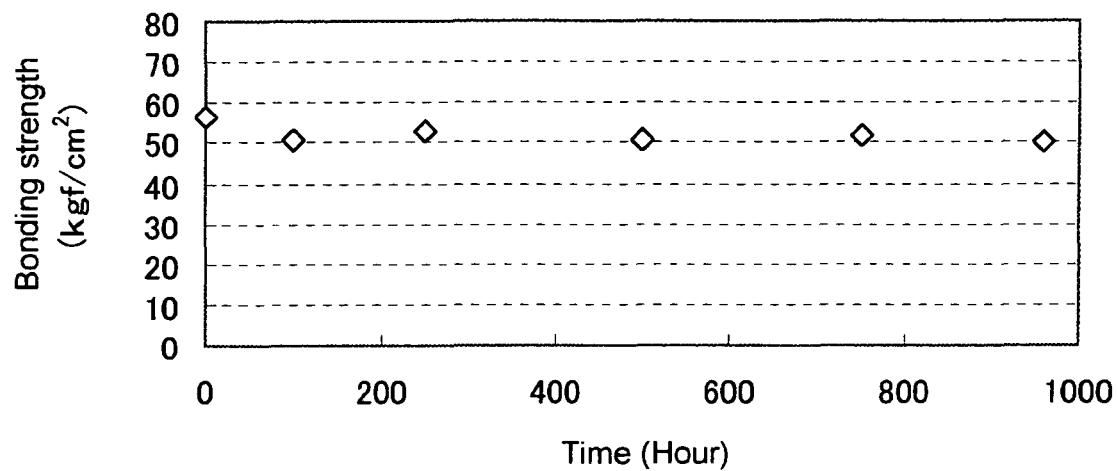
FIG. 19 is a graph showing a change in the bonding strength of the thermally cured thermosetting film in a high-temperature and high-humidity test.
Figure 20:
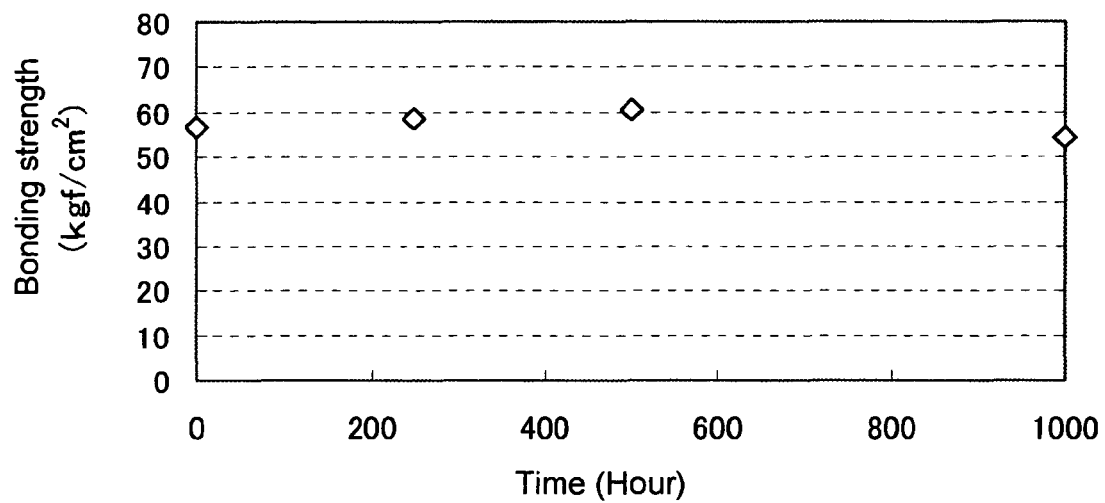
FIG. 20 is a graph showing a change in the bonding strength of the thermally cured thermosetting film in a heat cycle test.

FIG. 18 shows a change in the bonding strength in a high-temperature shelf test (125° C.), FIG. 19 shows a change in the bonding strength in a high-temperature and high-humidity test (temperature: 80° C.; relative humidity: 80%), and FIG. 20 shows a change in the bonding strength in a heat cycle test. Under any conditions, the specimen exhibited a bonding strength of about 50 to 60 kgf/cm$^2$, and a marked change was not found in the bonding strength.

The invention claimed is:

1. A method for producing a light emitting diode chip encapsulation product, the method comprising the steps of:
   covering a light emitting diode chip connected onto a substrate with a cut sheet of a thermosetting film, and
   thermally curing under a vacuum pressure using a vacuum pressure or a vacuum roll the cut sheet of the thermosetting film to thermally cure the cut sheet of the thermosetting film.

2. The method according to claim 1, wherein the step of thermally curing is carried out in a step comprising two stages or more.

3. The method according to claim 2, wherein the thermally cured cut sheet of the thermosetting film is capable of transmitting light.

4. The method according to claim 1, wherein the thermally cured cut sheet of the thermosetting film is capable of transmitting light.

5. The method according to claim 1, wherein the thermally cured cut sheet of the thermosetting film has a refractive index of 1.50 to 1.60.

6. The method according to claim 1, wherein the thermally cured cut sheet of the thermosetting film before being thermally cured has a thickness 1.2 to 1.5 times the height of the light emitting diode chip.

7. The method according to claim 1, wherein the thermally cured cut sheet of the thermosetting film exhibits a shrinkage percentage of 0.5 to 3.0%.

8. The method according to claim 1, wherein the cut sheet of the thermosetting film before being thermally cured has a viscosity of 10 to 10$^4$ Pas at a temperature of 150 to 200° C.

9. The method according to claim 1, wherein the thermosetting film is comprised of an epoxy resin composition.

10. A light emitting diode comprising the light emitting diode chip encapsulation product produced by the method according to claim 1.

11. A light emitting device comprising the light emitting diode according to claim 10.

* * * * *